United States Patent
Geng et al.

(10) Patent No.: US 11,984,685 B2
(45) Date of Patent: May 14, 2024

(54) RETENTION LATCH WITH SPRING MECHANISM

(71) Applicant: Intel Corporation, Santa Clara, CA (US)

(72) Inventors: Phil Geng, Portland, OR (US); Xiang Li, Portland, OR (US); George Vergis, Portland, OR (US); Mani Prakash, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 752 days.

(21) Appl. No.: 17/001,113

(22) Filed: Aug. 24, 2020

(65) Prior Publication Data

US 2020/0388962 A1    Dec. 10, 2020

(51) Int. Cl.
| | |
|---|---|
| *H01R 13/629* | (2006.01) |
| *H01R 12/72* | (2011.01) |
| *H01R 13/631* | (2006.01) |
| *H01R 13/635* | (2006.01) |
| *H05K 5/02* | (2006.01) |

(52) U.S. Cl.
CPC ..... *H01R 13/62988* (2013.01); *H01R 12/721* (2013.01); *H01R 13/631* (2013.01); *H01R 13/635* (2013.01); *H05K 5/0295* (2013.01)

(58) Field of Classification Search
CPC .......... H01R 12/7058; H01R 12/721; H01R 12/737; H01R 13/62988; H01R 13/6275; H01R 13/631; H01R 13/635; H05K 1/181; H05K 5/0295; H05K 5/1409

See application file for complete search history.

(56) References Cited

U.S. PATENT DOCUMENTS

| | | | | |
|---|---|---|---|---|
| 5,676,561 A * | 10/1997 | Chiang | ................ | H05K 7/1409 439/157 |
| 6,132,228 A * | 10/2000 | Lang | ................ | H01R 13/62988 439/160 |
| 6,200,149 B1 * | 3/2001 | Chi-Chung | ........ | H01R 12/7005 439/157 |
| 6,227,887 B1 * | 5/2001 | Choy | ................... | H01R 12/721 439/485 |
| 6,276,950 B1 * | 8/2001 | Yodogawa | ......... | H01R 12/7005 439/160 |
| 6,353,538 B1 * | 3/2002 | Ali | ...................... | H01L 25/0655 174/548 |

(Continued)

FOREIGN PATENT DOCUMENTS

| | | | | |
|---|---|---|---|---|
| EP | 1775802 | | 4/2007 | |
| EP | 3462546 A1 * | | 4/2019 | ......... H01R 12/7023 |
| KR | 20070001310 | | 12/2007 | |

OTHER PUBLICATIONS

International Search Report and Written Opinion for PCT Application No. PCT/US2021/040601, dated Oct. 26, 2021.

*Primary Examiner* — Marcus E Harcum
(74) *Attorney, Agent, or Firm* — Essential Patents Group, LLP

(57) ABSTRACT

An embodiment of a latch apparatus for a circuit board comprises a first latch body with a retention mechanism for the circuit board, a second latch body with a coupling mechanism for a connector, and a spring mechanism mechanically coupled between the first latch body and the second latch body. Other embodiments are disclosed and claimed.

14 Claims, 10 Drawing Sheets

(56) References Cited

U.S. PATENT DOCUMENTS

| | | | |
|---|---|---|---|
| 6,702,598 B1* | 3/2004 | Lo | H01R 12/7005 439/328 |
| 6,824,407 B1* | 11/2004 | Zhao | H01R 12/721 439/328 |
| 7,172,441 B2* | 2/2007 | Schlack | H01R 13/701 439/152 |
| 7,371,097 B1 | 5/2008 | Pennypacker et al. | |
| 7,654,840 B1* | 2/2010 | Zapata | H01R 13/62988 439/153 |
| 7,749,006 B2* | 7/2010 | Chiang | H05K 7/1409 439/160 |
| 7,967,618 B2* | 6/2011 | Chang | H01R 12/737 439/157 |
| 7,985,086 B1 | 7/2011 | Sun | |
| 8,657,612 B2* | 2/2014 | Lu | H01R 12/7011 439/328 |
| 8,747,133 B2* | 6/2014 | Shen | H01R 12/721 439/157 |
| 9,142,918 B2* | 9/2015 | Zhang | G06K 13/0812 |
| 9,325,090 B2* | 4/2016 | Shen | H01R 12/721 |
| 9,935,384 B1* | 4/2018 | Li | H01R 13/6335 |
| 9,948,026 B2* | 4/2018 | Mathews | H01R 12/774 |
| 10,070,549 B2* | 9/2018 | Su | H05K 7/1409 |
| 11,225,988 B2* | 1/2022 | Wang | F16B 5/0016 |
| 11,286,969 B2* | 3/2022 | Wang | F16B 1/04 |
| 11,489,274 B2* | 11/2022 | Wang | H05K 7/1489 |
| 2003/0148646 A1* | 8/2003 | Frantum, Jr. | H01R 12/7005 439/157 |
| 2009/0291572 A1 | 11/2009 | Dawiedczyk et al. | |
| 2011/0117768 A1* | 5/2011 | Li | H01R 12/7029 439/345 |
| 2011/0263146 A1* | 10/2011 | Su | H01R 12/7029 439/153 |
| 2015/0327389 A1* | 11/2015 | Westphall | H01R 13/62988 361/748 |
| 2018/0212362 A1* | 7/2018 | Wang | H01R 43/26 |
| 2019/0044262 A1 | 2/2019 | Geng et al. | |
| 2019/0165503 A1 | 5/2019 | Geng et al. | |
| 2019/0303333 A1* | 10/2019 | Ding | G11C 5/04 |
| 2020/0388962 A1 | 12/2020 | Geng et al. | |

* cited by examiner

RETENTION LATCH WITH SPRING MECHANISM

BACKGROUND

Electrical components such as circuit boards may be mechanically and/or electrically coupled together with connectors. A memory card, such as a dual-inline memory module (DIMM) may include rows of electrical connections along an edge of the card. A memory card connector may include a plurality of pins to be soldered to a main/parent board (e.g., a motherboard) and a slot to receive the edge of the memory card with the electrical connections. An insertion/ejection latch may help to insert and retain the memory card in the connector, and also to eject the memory card from the connector.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
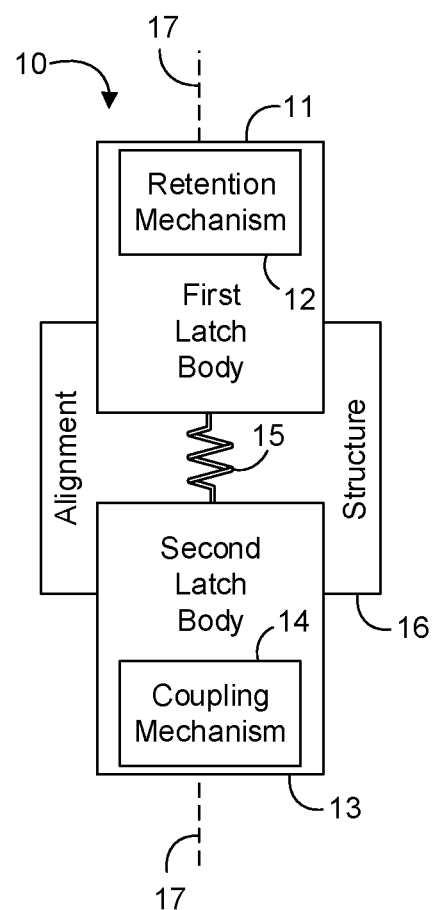
FIG. 1 is a block diagram of an example of a latch apparatus according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; flash memory devices; phase-change memory, qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

With reference to FIG. 1, an embodiment of a latch apparatus 10 for a circuit board may include a first latch body 11 with a retention mechanism 12 for the circuit board, a second latch body 13 with a coupling mechanism 14 for a connector, and a spring mechanism 15 mechanically coupled between the first latch body 11 and the second latch body 13. In some embodiments, the spring mechanism 15 may be configured to relax stress on the connector under a load event which exceeds a load threshold and to reseat the circuit board in the connector after the load event. For example, the spring mechanism 15 may be configured to extend the first latch body 11 relative to the second latch body 13 under the load event which exceeds the load threshold.

Some embodiments of the latch apparatus 10 may further include an alignment structure 16 proximate to the first latch body 11 and the second latch body 13 to constrain a translation of the first latch body 11 relative to the second latch body 13 along an axis 17. In some embodiments, the alignment structure 16 may comprise a sleeve that surrounds a first portion of the first latch body 11 and a second portion of the second latch body 13. Alternatively, or additionally, in some embodiments the alignment structure 16 may comprise and slot and tab structure formed between the first latch body 11 and the second latch body 13. In some embodiments, the retention mechanism of the first latch body 11 may comprise a protrusion to mate with a notch in the circuit board. In some embodiments, the second latch body 13 may comprise an ejector mechanism and the coupling mechanism may comprise a pivot mechanism. For example, the circuit board may comprise a memory card, such as a dual-inline memory module (DIMM).

Figure 2A:
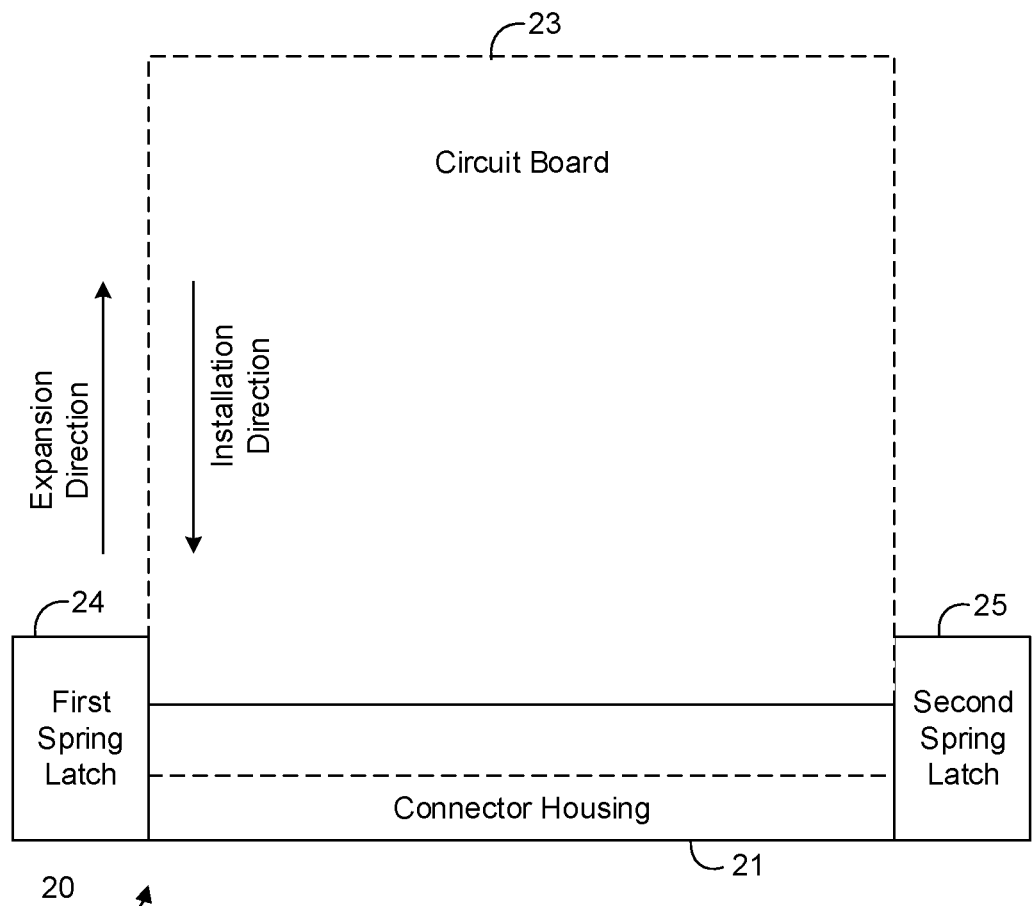
FIG. 2A is a front view of an example of a connector apparatus according to an embodiment.
Figure 2B:
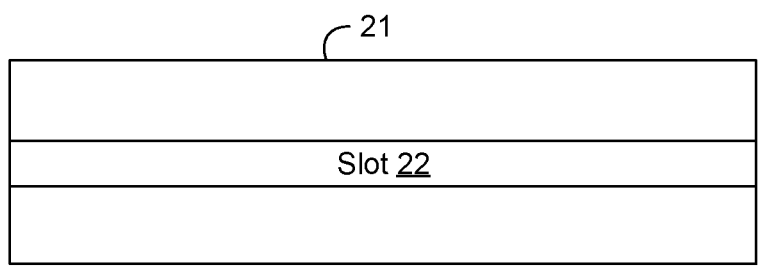
FIGS. 2B and 2C are top and side views of a connector housing from FIG. 2A, according to an embodiment.
Figure 2C:
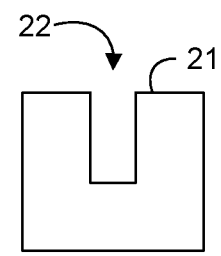
Figure 3A:
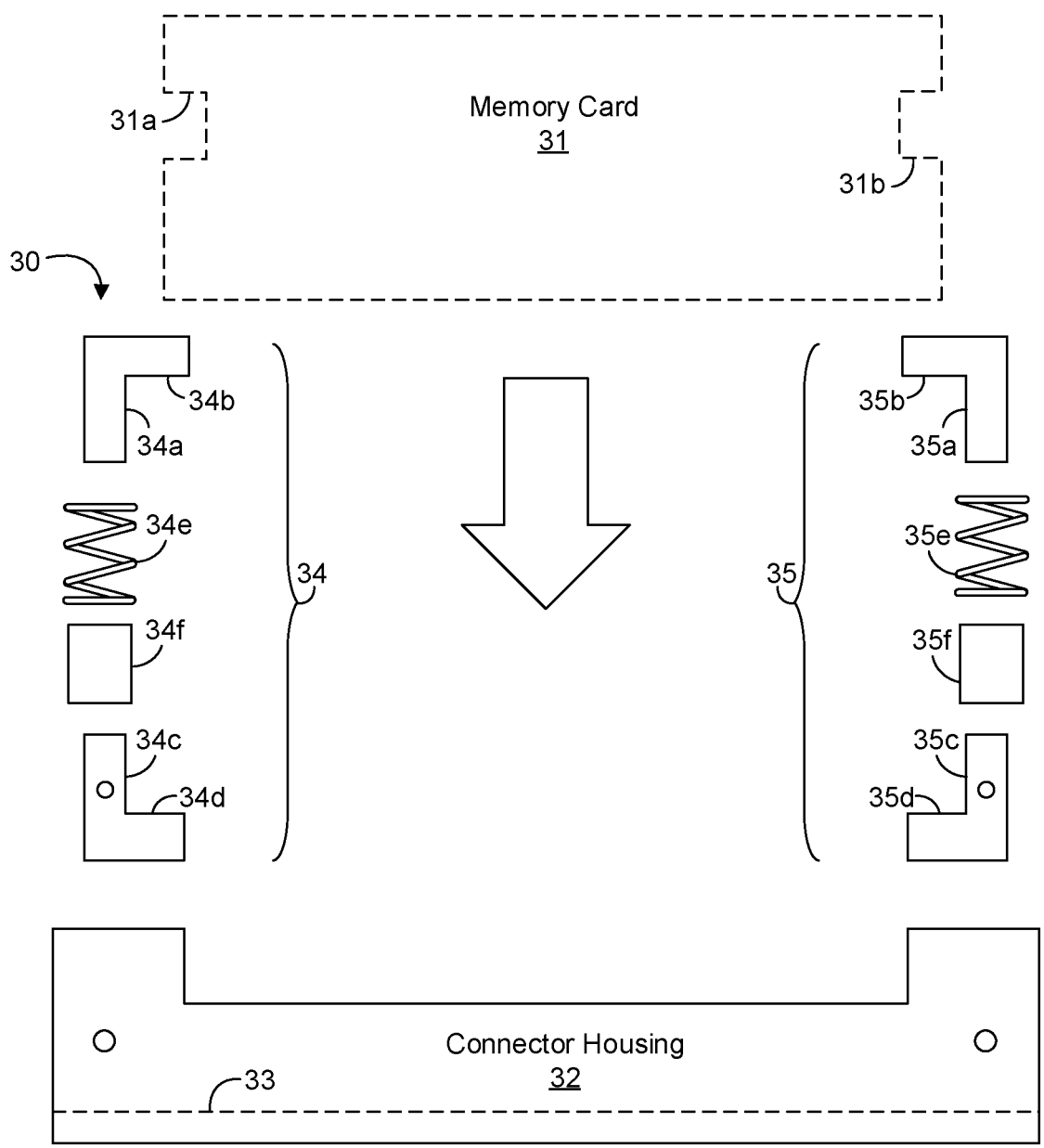
FIG. 3A is an exploded view of another example of a connector apparatus according to an embodiment.
Figure 3B:
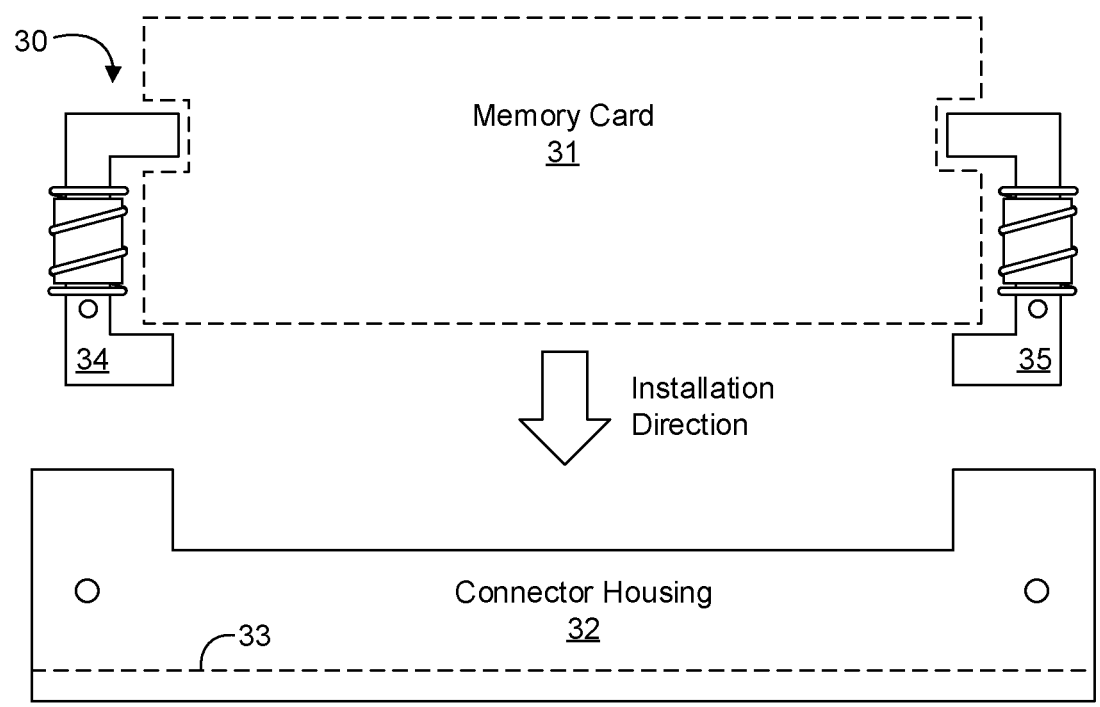
FIG. 3B is a partially exploded view of the connector apparatus from FIG. 3A, according to an embodiment.
Figure 3C:
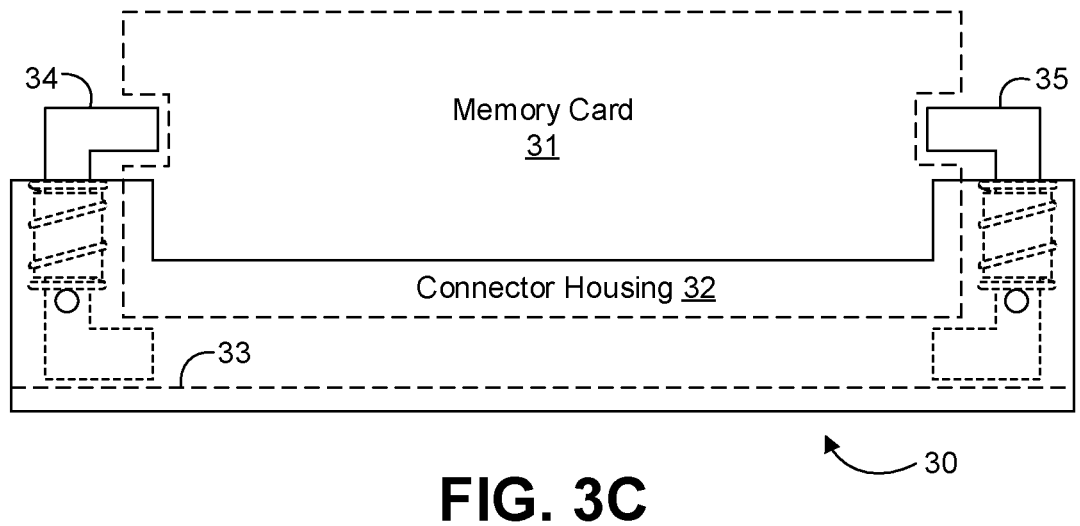
FIGS. 3C and 3D are front views of the connector apparatus from FIG. 3A with a latch in a retention position (FIG. 3C) and an expanded position (FIG. 3D).
Figure 3D:
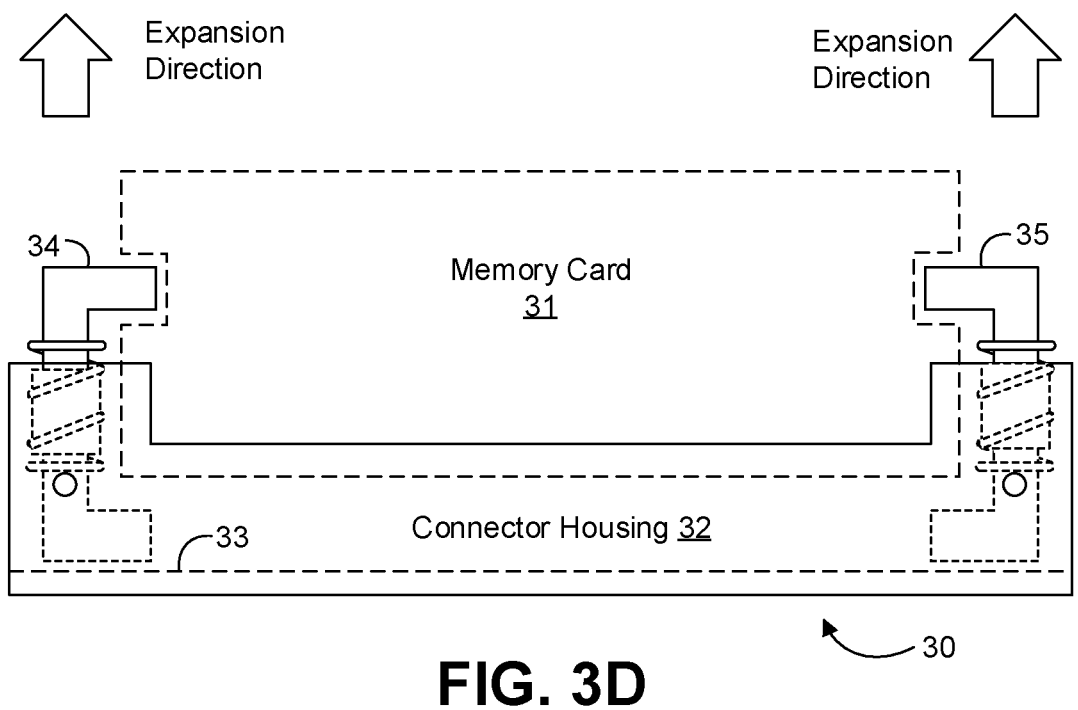

With reference to FIGS. 2A to 2C, an embodiment of a connector apparatus 20 may comprise a connector housing 21 including an elongated slot 22 to receive a circuit board 23, a first spring latch 24 pivotably coupled to the connector housing 21 at a first end of the elongated slot 22, and a second spring latch 25 pivotably coupled to the connector housing 21 at a second end of the elongated slot 22 opposite to the first end of the elongated slot 22. For example, the first spring latch 24 and/or the second spring latch 25 may be configured similar to the latch apparatus 10 (FIG. 1), or any of the other latch embodiments described herein. In some embodiments, each of the first spring latch 24 and the second spring latch 25 may respectively comprise a first latch body with a retention mechanism for the circuit board 23, a second latch body with an ejector mechanism for the circuit board 23, and a spring mechanism mechanically coupled between the first latch body and the second latch body. For example, an expansion direction of the spring mechanism in a retention position (e.g., with the circuit board 23 fully seated in the connector housing 21) may be located normal to an installation direction of the circuit board 23. In some embodiments, the spring mechanism may be configured to relax stress on the connector housing 21 under a load event which exceeds a load threshold and to reseat the circuit board 23 in the elongated slot 22 after the load event. For example, the spring mechanism may be arranged to extend the first latch body relative to the second latch body under the load event which exceeds the load threshold.

With reference to FIGS. 3A to 3D, an embodiment of a connector apparatus 30 for a memory card 31 may comprise a connector housing 32 including an elongated slot 33 to receive the memory card 31, a first latch 34 pivotably coupled to the connector housing 32 at a first end of the elongated slot 33, and a second latch 35 pivotably coupled to the connector housing 32 at a second end of the elongated slot 33 opposite to the first end of the elongated slot. The first latch 34 may include a first retention body 34a with a first protrusion 34b that mates with a first notch 31a in the memory card 31, a first ejector body 34c with a first foot 34d to eject the memory card 31, and a first spring 34e mechanically coupled between the first retention body 34a and the first ejector body 34c. The first spring 34e may be secured to both the first retention body 34a and the first ejector body 34c with any suitable means. The second latch 35 may include a second retention body 35a with a second protrusion 35b that mates with a second notch 31b in the memory card 31, a second ejector body 35c with a second foot 35d to eject the memory card 31, and a second spring 35e mechanically coupled between the second retention body 35a and the second ejector body 35c. The second spring 35e may be secured to both the second retention body 35a and the second ejector body 35c with any suitable means.

In some embodiments, an expansion direction of the first and second springs 34e, 35e in a retention position is normal to an installation direction of the memory card 31. For example, the connector apparatus 30 may further include a first alignment structure 34f coupled between the first retention body 34a and the first ejector body 34c to constrain an extension of the first retention body 34a relative to the first ejector body 34c along the expansion direction, and a second alignment structure 35f coupled between the second retention body 35a and the second ejector body 35c to constrain an extension of the second retention body 35a relative to the second ejector body 35c along the expansion direction. In some embodiments, the first and second springs 34e, 35e may be configured to relax stress on the connector housing under a load event which exceeds a load threshold and to reseat the memory card in the elongated slot after the load event. For example, the first and second springs may be arranged to extend the first and second retention bodies 34a, 35a respectively relative to the first and second ejector bodies 34c, 35c under the load event which exceeds the load threshold.

Some embodiments may advantageously provide a DIMM connector with spring latch retention for shock absorption of a heavy DIMM mass. With respect to a single DIMM device, higher bandwidth and/or higher capacity DIMMs may be heavier because a full-DIMM heat spreader may be required. Some systems may include multiple DIMMs, with more DIMMs needed to support more channels. Some systems may include multiple components integrated on a same circuit board, including a processor or CPU with a heavy air-cooled heatsink. Increased mass may increase the risk that a mechanical shock to the system may cause a DIMM connector related failure. Some embodiments may advantageously provide component level technology to mitigate DIMM connector shock risk.

With the increase of memory capacity on platform motherboards (e.g., 12, DIMMS, 24 DIMMs, 32 DIMMs, 48 DIMMs, etc.), the increase of DIMM heat spreader mass (e.g., DDR4 DIMM heat spreader mass of 30 grams, 40 grams, 50 grams, 60 grams, etc.), and/or the increase in utilization of 3D crosspoint memory components (e.g., DIMMs with INTEL OPTANE technology), a board level shock test may become a failure point (e.g., either an actual test failure or a simulated test failure). In one example with 48 DIMMs, the motherboard deflection may significantly higher because of the total DIMM mass as compared to platforms with fewer DIMMs. The increased mass may increase DIMM connector shock failure risk significantly due to the excessive board deflection.

A common DIMM connector failure mode under shock may include a broken latch. With a more robust design for the DIMM latch, another common shock failure mode is a DIMM connector solder joint j-lead pulling out of the connector housing. Both of these failure modes may have the same root cause of heavy DIMM mass. In addition, surface mounted DIMM connector solder joint shock failure risk will be increased with increased connector count and mass. At a component level, the DIMM mass is expected to increase due to increased thermal power. At a board level, the number of DIMMs is also expected to increase due to the need for increased memory capacity.

Some embodiments may advantageously mitigate failures under shock load with a DIMM connector latch design that a spring mechanism that allows a DIMM latch to extend under shock load and allows the DIMM to re-seat back to the DIMM connector after shock load. Some embodiments may allow more board flexure and reduce potential DIMM connector damage. Some embodiments may also avoid DIMM pop out failures after shock tests. Advantageously, some embodiments may reduce or eliminate DIMM connector latches becoming loose or connector housing damage under severe shock load, may save cost as compared to system level shock mitigation solutions (e.g., dampers, etc.), and may have no impact to routing of the motherboard.

Figure 4A:
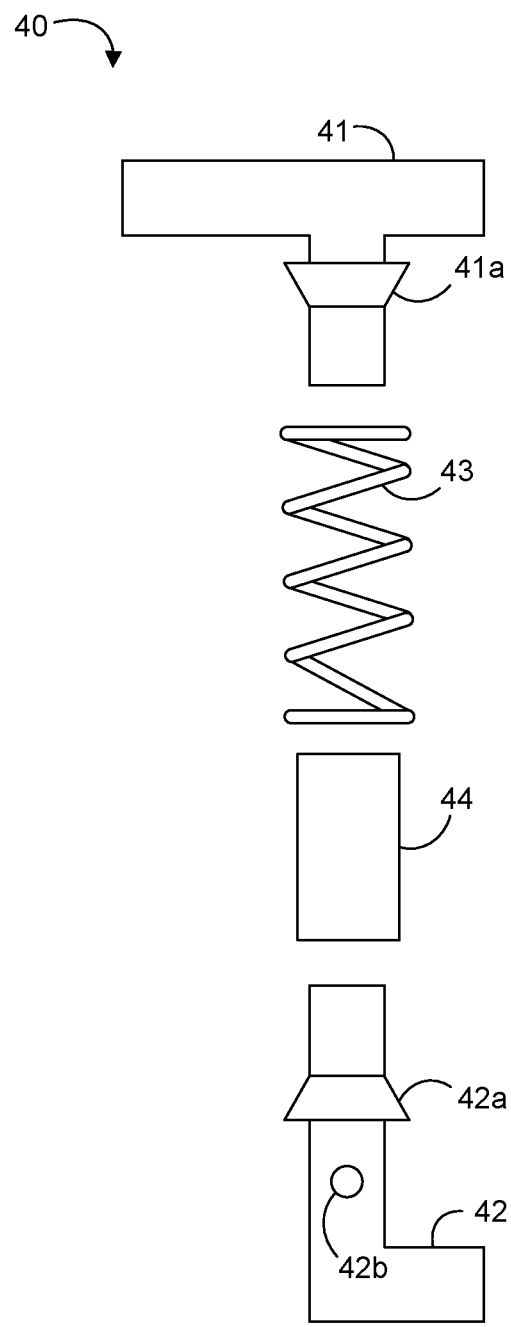
FIG. 4A is an exploded view of an example of a spring latch according to an embodiment.
Figure 4B:
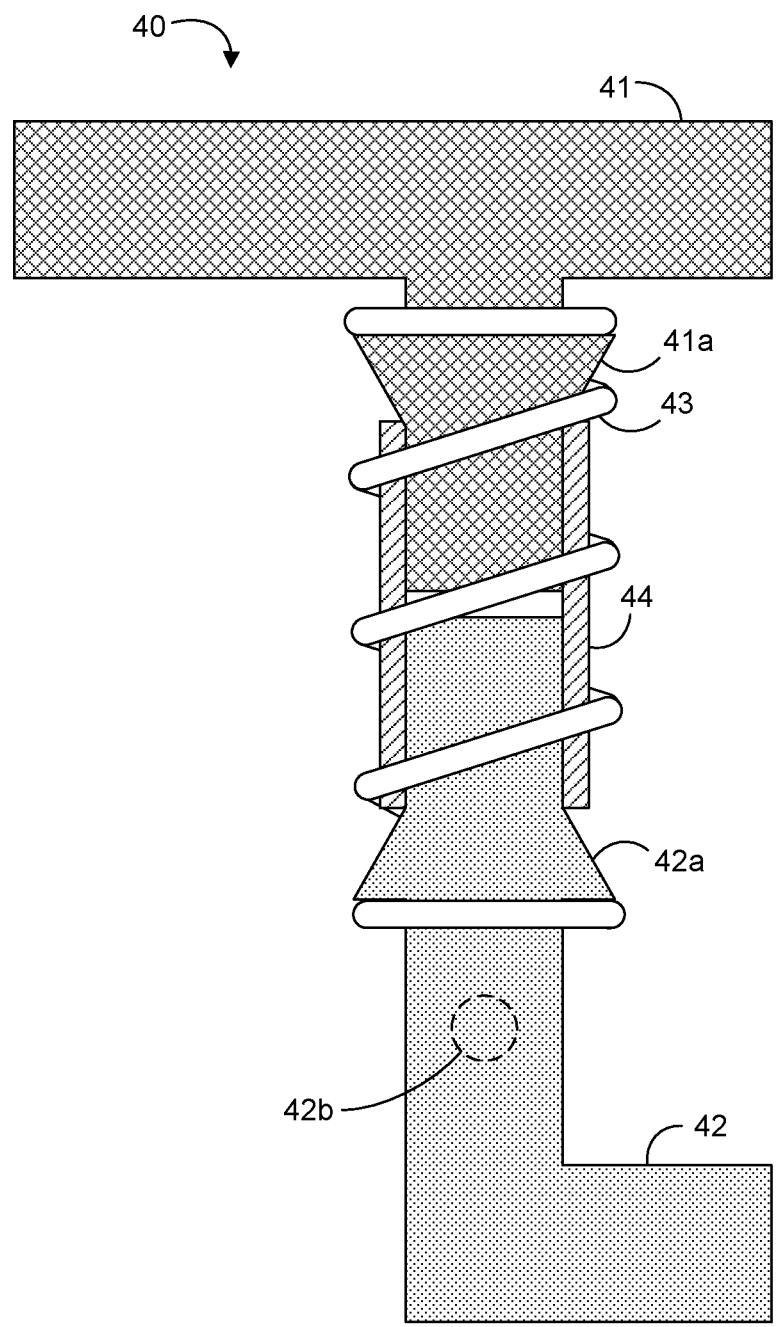
FIG. 4B is an assembled, partial cross-section view of the spring latch of FIG. 4A, according to an embodiment.
Figure 4C:
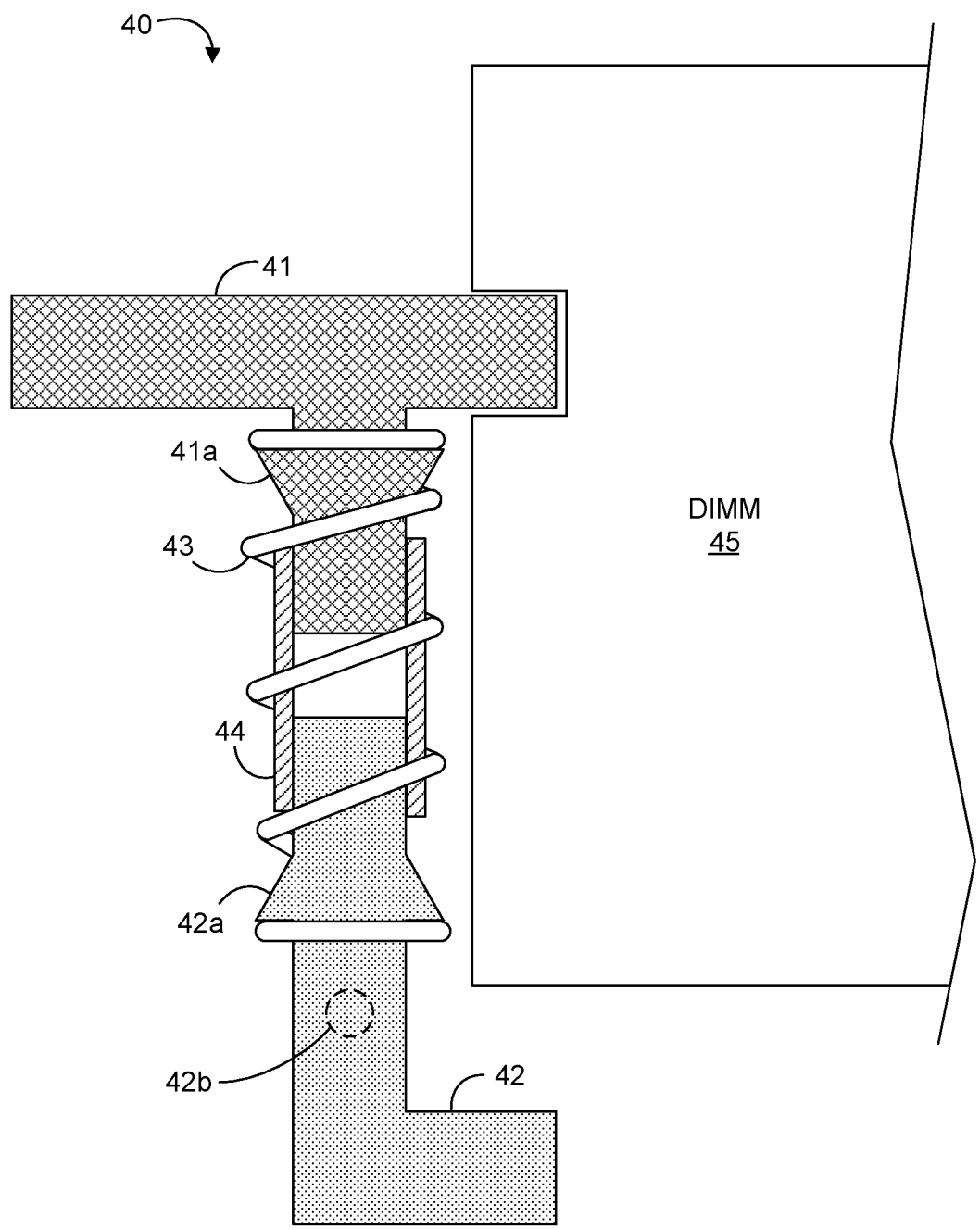
FIG. 4C is an assembled, partial cross-section view of the spring latch of FIG. 4A in an expanded position, according to an embodiment.

With reference to FIGS. 4A to 4C, an embodiment of a spring latch 40 may include a latch top part 41, a latch bottom part 42, and a latch spring 43. One end of the latch spring 43 is coupled to the latch top part 41 and the opposite end of the latch spring 43 is coupled to the latch bottom part 42. In this embodiment, for example, the latch top part 41 may include a collar 41a (e.g., a rim, a lip, a flange, a ring, etc.) to secure one end of the latch spring 43 and the latch bottom part 42 may include a collar 42a to secure the other end of the latch spring 43. The spring latch 40 may further include a connecting cylinder 44 arranged to contain respective portions of both the latch top part 41 and the latch bottom part 42. The connecting cylinder 44 may be positioned inside the latch spring 43 and may help constrain the movement of the latch top part 41 along an axis in the expansion direction relative to the latch bottom part 42. The latch bottom part 42 may further include opposed pivot posts 42b to couple the latch 40 to mating channels in the connector and to allow the latch 40 to pivot during insertion and ejection of a memory card in the connector.

Those skilled the art, given the benefit of the present specification and drawings, will appreciate that the spring stiffness may be configured as needed for particular connectors, memory cards, and/or shock load requirements. For example, with sufficient spring stiffness, some embodiments may allow a DIMM 45 to pullout of a connector under a specified shock load (e.g., see FIGS. 3D and 4C), which may advantageously mitigate or prevent both latch fracture and j-lead pull out of the connector housing. Embodiments with sufficient spring force may further keep a heavy DIMM from flying out of the connector during the shock event. Some embodiments may further provide sufficient spring force to pull the DIMM back to a seating plane after the shock event (e.g., to reseat the memory card).

In some embodiments, the spring is located normal to the board direction to mitigate the tensile force applied to the latch and solder joints due to board flexure during a shock event. In addition to constraining the expansion of the spring to an out of board Z-direction, in some embodiments the connecting cylinder 44 for the top and bottom latch part may be constructed from a suitable high strength material (e.g., metal, etc.). Advantageously, an embodiment of a suitably constructed high strength connecting cylinder 44 may advantageously mitigate or prevent a latch failure caused by shear force of and X or Y direction shock.

Figure 5:
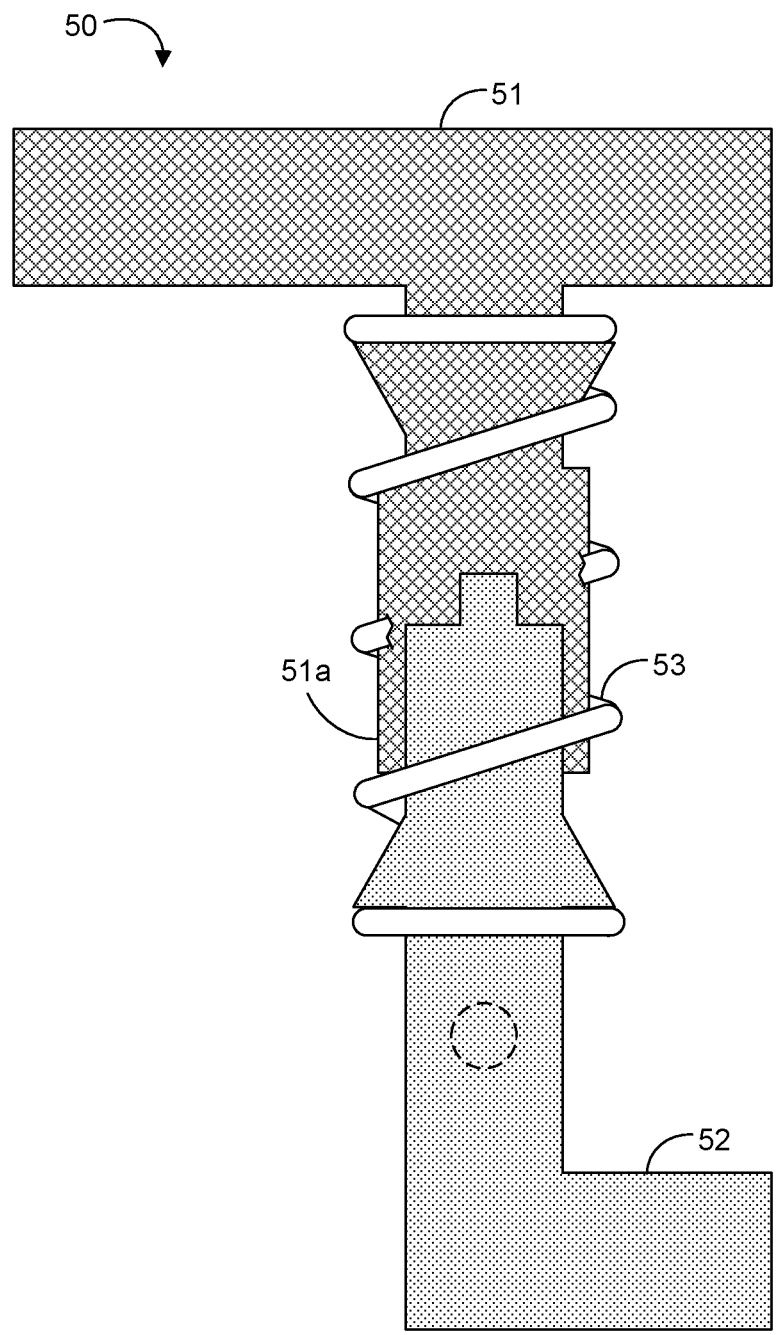
FIG. 5 is a partial cross-section view of another example of a spring latch according to an embodiment.

With reference to FIG. 5, an embodiment of a spring latch 50 include a latch top part 51, a latch bottom part 52, and a spring 53 mechanically coupled to both the latch top part 51 and the latch bottom part 52. The latch top part 51 includes an integral sleeve portion 51a that surrounds a portion of the latch bottom part 52 and constrains the movement of the latch top part 51 along an axis relative to the latch bottom part 52.

Figure 6:
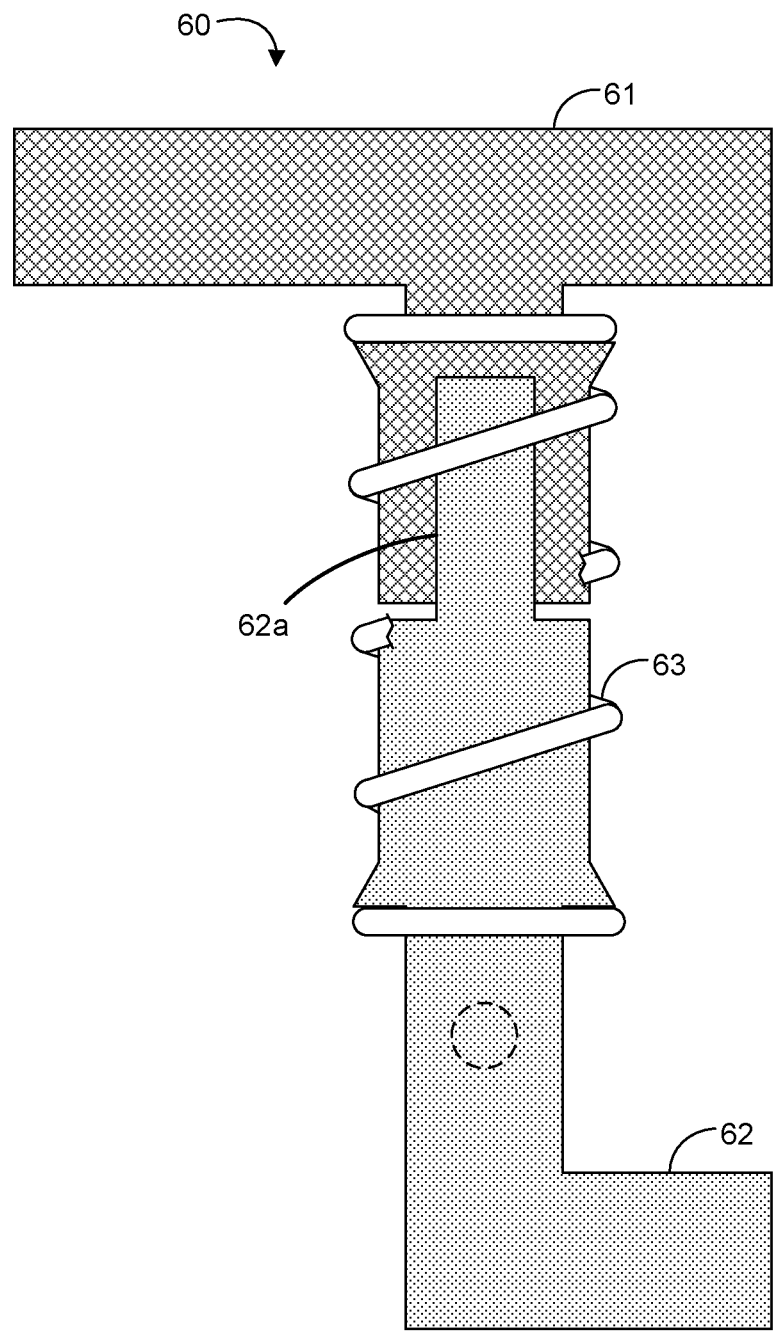
FIG. 6 is a partial cross-section view of another example of a spring latch according to an embodiment.

With reference to FIG. 6, an embodiment of a spring latch 60 include a latch top part 61, a latch bottom part 62, and a spring 63 mechanically coupled to both the latch top part 61 and the latch bottom part 62. The latch bottom part 62 includes an integral post 62a that fits in a corresponding channel in the latch top part 61 and constrains the movement of the latch top part 61 along an axis relative to the latch bottom part 62.

The embodiments described herein illustrate only non-limiting examples of retention mechanisms, coupling mechanisms, pivot mechanisms, and mating mechanisms for spring latches. Given the benefit of the present specification and drawings, numerous other examples will occur to those skilled in the art.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds, costs, and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A latch apparatus for a circuit board, comprising:
   a first latch body comprising a retention mechanism which comprises a protrusion to mate with a notch in a circuit board, wherein the first latch body forms a first collar structure;

a second latch body comprising a coupling mechanism for a connector, wherein the second latch body forms a second collar structure;

an alignment structure in a region between the retention mechanism and the coupling mechanism, wherein the alignment structure is to constrain a translation of the first latch body relative to the second latch body along an axis; and a spring mechanism which extends around the first collar structure to be mechanically coupled to the first latch body, which further extends around the second collar structure to be mechanically coupled to the second latch body, and which further extends around the alignment structure, wherein the spring mechanism is to relax stress on the connector under a load event which exceeds a load threshold, and is further to reseat the circuit board in the connector after the load event.

2. The latch apparatus of claim 1, wherein the spring mechanism is to extend the first latch body relative to the second latch body under the load event which exceeds the load threshold.

3. The latch apparatus of claim 1, wherein the alignment structure comprises a sleeve that surrounds a first portion of the first latch body and a second portion of the second latch body.

4. The latch apparatus of claim 1, wherein the alignment structure comprises and slot and tab structure formed between the first latch body and the second latch body.

5. The latch apparatus of claim 1, wherein the second latch body comprises an ejector mechanism and wherein the coupling mechanism comprises a pivot mechanism.

6. The latch apparatus of claim 1, wherein the circuit board comprises a memory card.

7. The latch apparatus of claim 1, wherein the circuit board comprises a dual-inline memory module.

8. A connector apparatus, comprising:
a connector housing including an elongated slot to receive a circuit board;
a first spring latch pivotably coupled to the connector housing at a first end of the elongated slot, a first spring latch comprising:
  a first latch body comprising a retention mechanism which comprises a protrusion to mate with a notch in the circuit board, wherein the first latch body forms a first collar structure;
  a second latch body comprising a coupling mechanism coupled to the connector, wherein the second latch body forms a second collar structure;
  an alignment structure in a region between the retention mechanism and the coupling mechanism, wherein the alignment structure is to constrain a translation of the first latch body relative to the second latch body along an axis; and
  a spring mechanism which extends around the first collar structure to be mechanically coupled to the first latch body, which further extends around the second collar structure to be mechanically coupled to the second latch body, and which further extends around the alignment structure, wherein the spring mechanism is to relax stress on the connector under a load event which exceeds a load threshold, and is further to reseat the circuit board in the connector after the load event; and a second spring latch pivotably coupled to the connector housing at a second end of the elongated slot opposite to the first end of the elongated slot.

9. The connector apparatus of claim 8, wherein an expansion direction of the spring mechanism in a retention position is located normal to an installation direction of the circuit board.

10. The connector apparatus of claim 8, wherein the spring mechanism is to extend the first latch body relative to the second latch body under the load event which exceeds the load threshold.

11. A connector apparatus for a memory card, comprising:
a connector housing including an elongated slot to receive the memory card;
a first latch pivotably coupled to the connector housing at a first end of the elongated slot, the first latch including:
  a first retention body comprising a retention mechanism which comprises a first protrusion that mates with a first notch in the memory card, wherein the first retention body forms a first collar structure,
  a first ejector body comprising a first foot to eject the memory card, wherein the first ejector body forms a second collar structure,
  a first alignment structure in a region between the retention mechanism and the first foot, wherein the first alignment structure is to constrain a translation of the first retention body relative to the first ejector body along an axis, and
  a first spring which extends around the first collar structure to be mechanically coupled to the first retention body, which further extends around the second collar structure to be mechanically coupled to the first ejector body, and which further extends around the first alignment structure; and
a second latch pivotably coupled to the connector housing at a second end of the elongated slot opposite to the first end of the elongated slot, the second latch including:
  a second retention body comprising a second protrusion that mates with a second notch in the memory card,
  a second ejector body comprising a second foot to eject the memory card, and
  a second spring mechanically coupled between the second retention body and the second ejector body;
wherein the first spring and the second spring are to relax stress on the connector housing under a load event which exceeds a load threshold, and are further to reseat the memory card in the elongated slot after the load event.

12. The connector apparatus of claim 11, wherein an expansion direction of the first and second springs in a retention position is normal to an installation direction of the memory card.

13. The connector apparatus of claim 12, further comprising:
a second alignment structure coupled between the second retention body and the second ejector body to constrain an extension of the second retention body relative to the second ejector body along the expansion direction.

14. The connector apparatus of claim 11, wherein:
the first spring is to extend the first retention body relative to the first ejector body under the load event which exceeds the load threshold; and
the second spring is to extend the second retention body relative to the second ejector body under the load event which exceeds the load threshold.

* * * * *